(12) United States Patent
Xiang

(10) Patent No.: US 7,005,302 B2
(45) Date of Patent: Feb. 28, 2006

(54) SEMICONDUCTOR ON INSULATOR SUBSTRATE AND DEVICES FORMED THEREFROM

(75) Inventor: Qi Xiang, San Jose, CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 0 days.

(21) Appl. No.: 10/819,441

(22) Filed: Apr. 7, 2004

(65) Prior Publication Data

US 2005/0224879 A1 Oct. 13, 2005

(51) Int. Cl.
*H01L 29/72* (2006.01)

(52) U.S. Cl. .................. 438/3; 438/578; 438/684; 438/620; 438/706; 438/197; 257/347; 257/295

(58) Field of Classification Search ............ 438/578, 438/689, 706, 620, 3, 197; 257/295
See application file for complete search history.

(56) References Cited

U.S. PATENT DOCUMENTS

| | | | | |
|---|---|---|---|---|
| 5,830,270 A | * | 11/1998 | McKee et al. ............ | 117/106 |
| 2002/0140031 A1 | | 10/2002 | Rim | |
| 2002/0195599 A1 | | 12/2002 | Yu et al. | |
| 2003/0008521 A1 | | 1/2003 | Bojarczuk, Jr. et al. | |
| 2003/0020070 A1 | * | 1/2003 | Rockwell et al. ........... | 257/76 |
| 2003/0027408 A1 | | 2/2003 | Curless | |
| 2003/0047785 A1 | | 3/2003 | Kawasaki et al. | |

FOREIGN PATENT DOCUMENTS

WO WO 2004/061920 A2 7/2004
WO WO 2004/068585 A1 8/2004

OTHER PUBLICATIONS

Lucovsky G. et al.: "Electronic Structure of high-k transition metal oxides and their silicate and aluminate alloys" Journal of Vacuum Science and Technology. B, Microelectronics and Nanometer Structures Processing, Measurement and Phenomena, American Institute of Physics, New York, NY, US, vol. 20, No. 4, Jul. 2002, pp. 1739-1747, XP012009458; ISSN: 1071-1023, p. 1741, column 2, paragraph 2- p. 1742, column 1, paragraph 1.

Lim Seung-Gu et al.: "Dielectric functions and optical bandgaps of high-K dielectrics for metal-oxide-semiconductor field-effect transistors ellipsometry" Journal of Applied Physics, American Institute of Physics. New York, US, vol. 91, No. 7, Apr. 1, 2002, pp. 4500-4505, XP012056135; ISSN: 0021-8979, p. 4500, column 2, paragraph 2.

Schubert J. et al.: "Structural and optical properties of epitaxial BaTiO3 thin filims grown on GdScO3(110)" Applied Physics Letters, American Institute of Physics. New York, US, vol. 82, No. 20, May 19, 2003, pp. 3460-3462, XP012034126; ISSN: 0003-6951, table 1.

(Continued)

Primary Examiner—Edward Wojciechowicz
(74) Attorney, Agent, or Firm—Foley & Lardner LLP

(57) ABSTRACT

A semiconductor on insulator (SOI) device is comprised of a layer of a dielectric material having a perovskite lattice, such as a rare earth scandate. The dielectric material is selected to have an effective lattice constant that enables growth of semiconductor material having a diamond lattice directly on the dielectric. Examples of the rare earth scandate dielectric include gadolinium scandate ($GdScO_3$), dysprosium scandate ($DyScO_3$), and alloys of gadolinium and dysprosium scandate ($Gd_{1-x}Dy_xScO_3$).

35 Claims, 7 Drawing Sheets

OTHER PUBLICATIONS

Epitaxial Semiconductor/High-K Ternary Oxide Heterostructures, Darrell G. Schlom, 2003.

Structural and optical properties of epitaxial $BaTiO_3$ thin films grown on $GdSc\ o_3$ (110), J. Schubert et al., Applied Physics Letters, vol. 82, No. 20, p. 3460-62, May 19, 2003.

Solid State Electronic Devices, Ben G. Streetman, p. 1-13, 1980, Prentice-Hall, Inc.

Molecular Beam Epitaxial Growth of Oxide Thin Films, Darrell G. Schlom, www.matse.psu.edu/faculty/schlom.html, 2004.

Structure, Vibration and Electron Density in Neodymium-Iron-Boride and some Rare-Earth Perovskite Oxides, Douglas J. du Boulay, Thesis, University of Western Australia, Chapter 3, 1996.

* cited by examiner

US 7,005,302 B2

SEMICONDUCTOR ON INSULATOR SUBSTRATE AND DEVICES FORMED THEREFROM

BACKGROUND OF THE INVENTION

1. Field of the Invention

The present invention relates generally to fabrication of insulated gate field effect transistors (MOSFETs), and, more particularly, to MOSFETs that are formed on an insulating substrate.

2. Related Technology

MOSFETs are a common component of integrated circuits (ICs). FIG. 1 shows a cross sectional view of a conventional MOSFET device. The MOSFET is fabricated on a bulk silicon substrate 10 within an active region bounded by shallow trench isolations 12 that electrically isolate the active region of the MOSFET from other IC components fabricated on the substrate 10. The MOSFET is comprised of a gate 14 and a channel region 16 that are separated by a thin gate insulator 18 such as silicon oxide or silicon oxynitride. The gate 14 is typically formed of a heavily doped semiconductor material such as polysilicon. The source and drain regions of the MOSFET comprise shallow source and drain regions 24 and deep source and drain regions 20 formed on opposing sides of the channel region 16. The shallow source and drain regions 24 are implanted after the formation of a protective layer 26 over the substrate. Deep source and drain regions 20 are then formed by ion implantation after formation of a spacer 22 around the gate 14. Source and drain silicides 28 are formed on the deep source and drain regions 20 to provide ohmic contacts and reduce contact resistance. The silicides 28 are comprised of the substrate semiconductor material and a metal such as cobalt (Co) or nickel (Ni). A silicide 30 is also formed at the upper surface of the gate 14.

An alternative to the formation of devices on bulk semiconductor substrates is semiconductor on insulator (SOI) construction. In SOI construction, MOSFETs are formed on a substrate that includes a layer of a dielectric material beneath the MOSFET active regions. SOI devices have a number of advantages over devices formed in a bulk semiconductor substrate, such as better isolation between devices, reduced leakage current, reduced latch-up between CMOS elements, reduced chip capacitance, and reduction or elimination of short channel coupling between source and drain regions. FIG. 2 shows an example of a conventional fully depleted SOI MOSFET. The SOI MOSFET is formed on an SOI substrate comprised of a silicon layer 32 and a dielectric layer 34. The MOSFET structure is formed on an isolated region 36 of a silicon layer that has been etched to define individual islands on which individual devices are formed. A thin undoped channel region 16 is located at the center of the silicon region 36. Source and drain extensions 24 are implanted into the silicon region 36 at opposing sides of a gate 14 formed on a gate insulator 18. Following formation of a spacer 22, elevated source and drain regions 38 are grown on the silicon region 38, and silicide source and drain contacts 28 and a silicide gate contact 30 are then formed.

One option for enhancing MOSFET performance is to increase the carrier mobility of the MOSFET semiconductor material so as to reduce resistance and power consumption and to increase drive current, frequency response and operating speed. A method of increasing carrier mobility that has become a focus of recent attention is the use of silicon material to which strain is applied. Tensile strained silicon may be formed by growing an epitaxial layer of semiconductor on a silicon germanium substrate. The silicon germanium lattice has a slightly larger lattice constant than a pure silicon lattice due to the presence of the larger germanium atoms in the lattice. Since the epitaxially grown silicon aligns itself to the silicon germanium lattice, a tensile strain is created in the silicon lattice. A moderate tensile strain increases electron mobility, and a more substantial tensile strain increases hole mobility. The amount of tensile strain increases with the proportion of germanium in the silicon germanium lattice. It has also been found that a moderate compressive strain improves hole mobility.

An example of a MOSFET incorporating a tensile strained silicon layer is shown in FIG. 3. The MOSFET is fabricated on a substrate comprising a silicon germanium layer 32 grown on a silicon layer 10. The silicon germanium layer is typically a graded layer in which the germanium content is gradually increased from zero to between 10% to 40%, depending on the amount of strain that is desired. An epitaxial layer of strained silicon 34 is grown on the silicon germanium layer 32. The MOSFET uses conventional MOSFET structures including deep source and drain regions 20, shallow source and drain extensions 24, a gate oxide layer 18, a gate 14 surrounded by a protective layer 26, a spacer 22, source and drain silicides 28, a gate silicide 30, and shallow trench isolations 12. The strained silicon material in the channel region 16 provides enhanced carrier mobility between the source and drain.

Strained silicon may also be incorporated into a MOSFET formed on an SOI substrate. FIG. 4 shows an example of a strained silicon SOI MOSFET. In this device, the MOSFET is formed on an SOI substrate that comprises a silicon germanium layer that overlies a dielectric layer 40. The silicon germanium layer is patterned to define isolated regions 42 on which individual MOSFETs are formed. A strained silicon layer 44 is grown on the silicon germanium region 42. The MOSFET is then formed in a manner similar to that of the conventional strained silicon device of FIG. 3.

It is difficult to form a fully depleted SOI device that incorporates a strained silicon channel. To control the short channel effect, a fully depleted SOI MOSFET preferably has a channel region thickness that is no more than approximately one third of the channel length. However, given the need to provide a supporting layer of silicon germanium beneath the strained silicon channel, the total channel thickness becomes a limitation on channel length, or else the thickness of strained silicon is not sufficient to provide significant mobility enhancement.

Other considerations present further obstacles for miniaturization of SOI devices generally. In conventional fully depleted SOI devices, it is typical to produce a very thin channel layer by performing chemical mechanical polishing (CMP) on the substrate until a desired thickness of semiconductor material remains. However, CMP produces a non-uniform surface that can have a variance in thickness of as much as 100 Å. As critical dimensions are reduced, such variability in thickness becomes unacceptable. For example, for a 45 nm device, a channel region thickness of approximately 150 Å is desirable. Given the thickness variability of polished layers, it is very difficult to reliably produce channel layers having the correct thickness at these dimensions.

It would be desirable to grow a layer of semiconductor material on a dielectric material in order to achieve an essentially uniform channel region thickness. However, conventional semiconductor device production techniques rely on the use of crystal lattices as templates for the growth of additional crystalline material. For example, silicon wafers are constituted of single crystal silicon that is cut along one of the crystal faces to provide a regular crystal lattice. This lattice serves as a template to which deposited atoms of silicon or other elements having the same lattice structure will align upon deposition, thus forming additional single crystal material. In the absence of such a template, deposited silicon takes the form of polycrystalline silicon or amorphous silicon, which is composed of individual grains each having a crystal lattice that is randomly oriented with respect to those of the surrounding grains. These forms of silicon exhibit poor conductivity compared to single crystal silicon and therefore are not desirable for use in the active regions of MOSFETs. Therefore, to date it has generally not been possible to grow single crystal silicon on other materials, particularly conventional dielectrics such as silicon oxide and silicon oxynitride, whose structures are essentially amorphous or do not match the silicon lattice.

Therefore the conventional techniques for producing semiconductor on insulator devices are not satisfactory for producing devices having small critical dimensions and devices incorporating strained silicon.

SUMMARY OF THE INVENTION

Embodiments of the invention provide semiconductor on insulator devices comprised of a dielectric layer upon which a semiconductor layer may be directly grown. The properties of the dielectric layer and the properties of the semiconductor layer may be chosen so that the dielectric layer imparts a tensile strain or a compressive strain to the semiconductor material.

Further embodiments of the invention provide methods for formation of such devices.

Certain preferred embodiments of the invention utilize a layer of a dielectric material having a perovskite lattice structure. The perovskite lattice has been found to provide a suitable template for growth of diamond lattice semiconductors. Examples of dielectrics having a perovskite lattice structure include rare earth scandate compounds such as gadolinium scandate (GdScO$_3$), dysprosium scandate (DyScO$_3$), and alloys of gadolinium and dysprosium scandate (Gd$_{1-x}$Dy$_x$ScO$_3$). Examples of semiconductor materials having a diamond lattice structure that is compatible with the rare earth scandates include silicon, germanium, alloys of silicon and germanium, and III–V type semiconductor materials such as gallium arsenide. The stoichiometric compositions of the rare earth scandate and the semiconductor material may be designed such that the rare earth scandate imparts a tensile strain or a compressive strain to the semiconductor material grown thereon. Such dielectric materials may be used as a dielectric layer in semiconductor on insulator MOSFETs, allowing a thin semiconductor layer to be grown directly on the dielectric layer.

DESCRIPTION OF THE DRAWINGS

Embodiments of the invention are described in conjunction with the following drawings, in which.

DETAILED DESCRIPTION OF PREFERRED EMBODIMENTS

In accordance with embodiments of the invention, single crystal semiconductor materials having a diamond lattice may be grown on a dielectric layer having a perovskite lattice. Semiconductor materials having a diamond lattice include silicon, germanium, and silicon germanium alloys. Compound semiconductors that have a species of diamond lattice sometimes referred to as a zinc blende lattice may also be grown on the perovskite lattice and will be considered to have a diamond lattice for purposes of this disclosure. Examples of such compound semiconductors include III–V type semiconductors such as gallium arsenide (GaAs), as well as certain II–VI type semiconductors. Examples of dielectrics having a perovskite lattice structure include rare earth scandate compounds such as gadolinium scandate (GdScO$_3$), dysprosium scandate (DyScO$_3$), and alloys of gadolinium and dysprosium scandate (Gd$_{1-x}$Dy$_x$ScO$_3$). The stoichiometric compositions of the rare earth scandate and the semiconductor material may be designed to provide a lattice mismatch such that the rare earth scandate imparts a tensile strain or a compressive strain to the semiconductor material grown thereon.

In one exemplary embodiment, a layer of the rare earth scandate gadolinium scandate (GdScO$_3$) is used as a dielectric layer and as a supporting layer for growth of a tensile strained silicon or silicon germanium layer. Single crystal gadolinium scandate has a dielectric constant of 22–35 and is therefore an excellent dielectric material for SOI applications.

Figure 1:
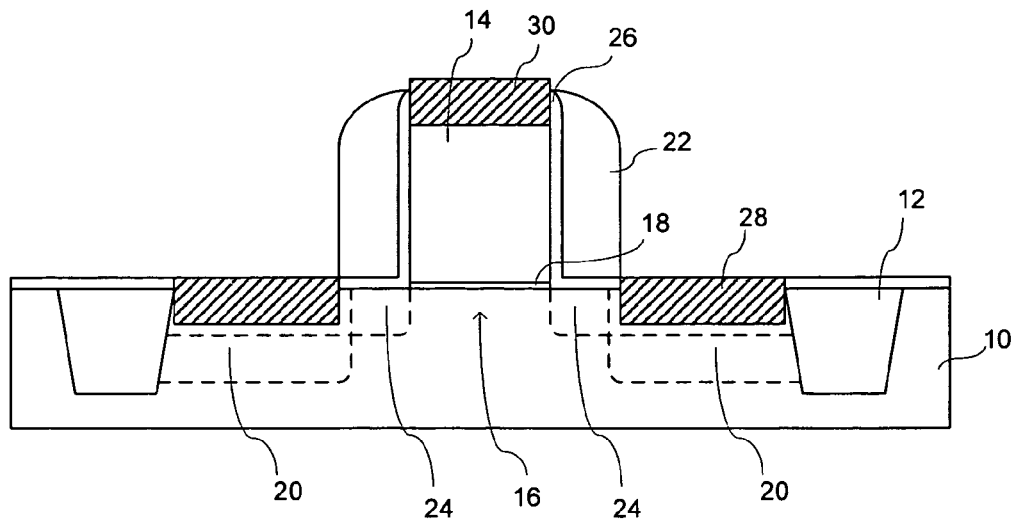
FIG. 1 shows a conventional MOSFET formed in accordance with conventional processing.
Figure 2:
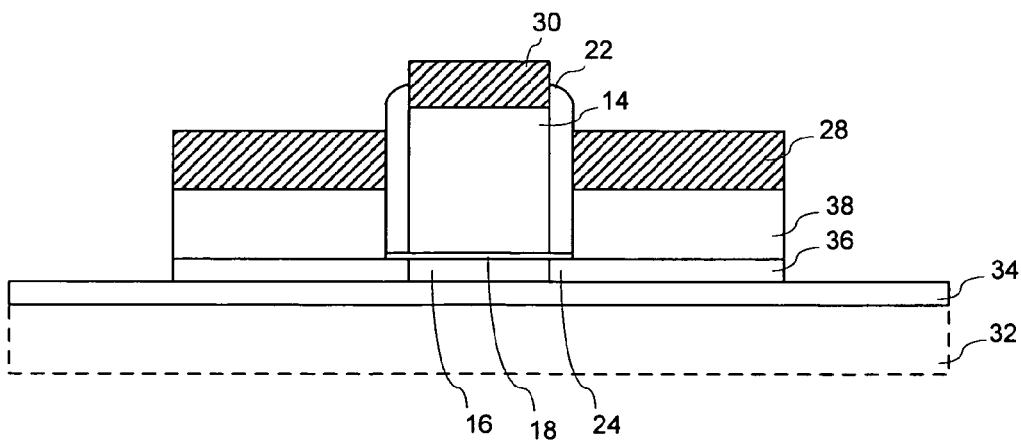
FIG. 2 shows a conventional SOI MOSFET.
Figure 3:
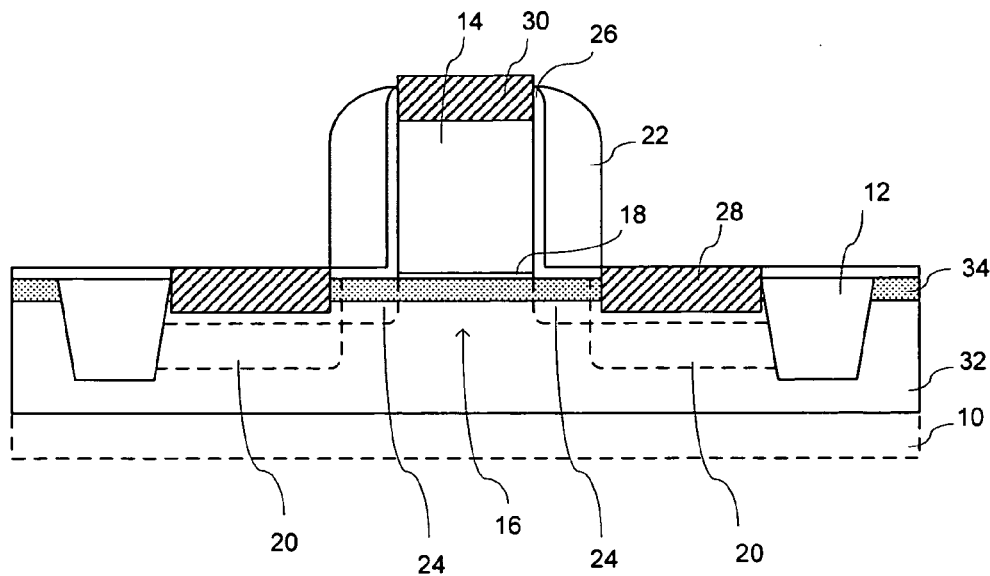
FIG. 3 shows a conventional strained silicon MOSFET.
Figure 4:
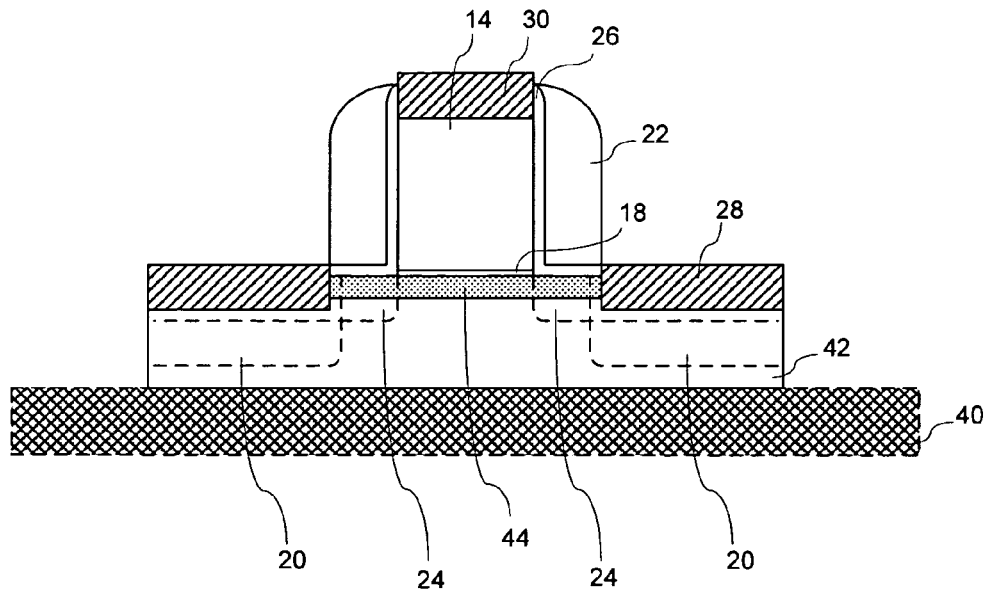
FIG. 4 shows a strained silicon MOSFET formed on an SOI substrate using conventional techniques.
Figure 5A:
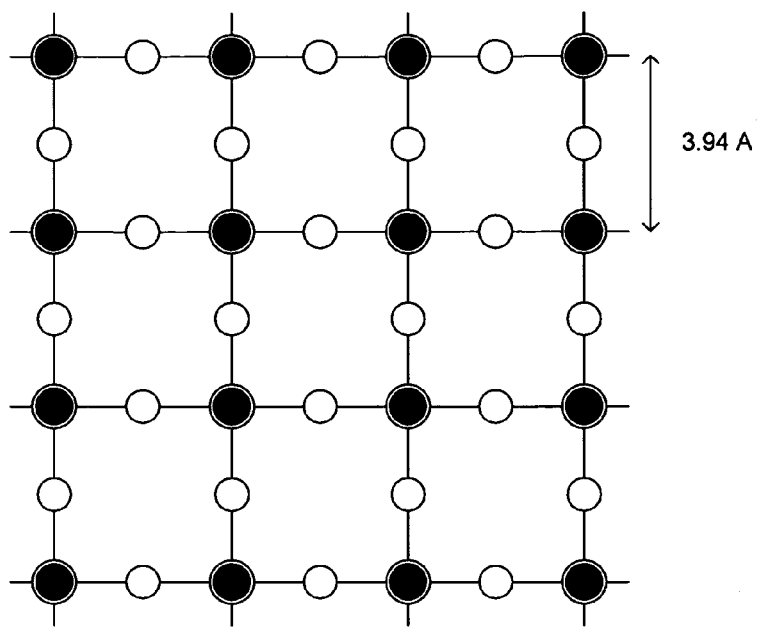
FIGS. 5a, 5b and 5c show the perovskite and diamond lattices, and the manner in which these lattices are compatible.

FIG. 5a illustrates the (001) faces of unit cells in the perovskite lattice of gadolinium scandate (GdScO$_3$). In its ideal form, the perovskite lattice has Pm3m symmetry. In other words, the unit cell of the lattice is a cube with one of the cations (e.g. Gd) at the center of the cube, the other of the cations (e.g. Sc) at each corner, and an anion (O) centered along each edge. In most perovskite lattices, the lattice is somewhat distorted from a perfect cubic form as a result of the particular atoms in the lattice, but the general structure remains the same. Consequently, the faces of the unit cell are essentially square with no face-centered atom.

Figure 5B:
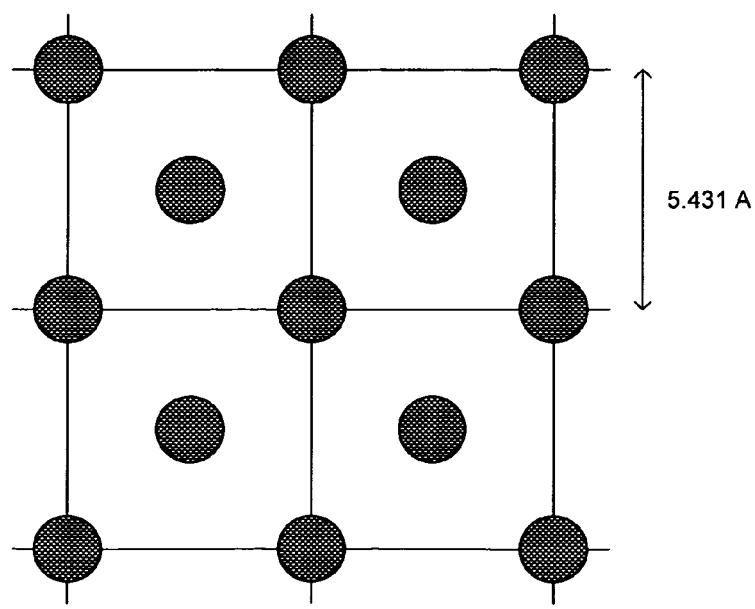

FIG. 5b illustrates the (001) faces of unit cells in the diamond lattice of silicon. The diamond lattice is essentially comprised of two interpenetrating face-centered cubic lattices, each offset from the other by ¼ of the length of the lattice constant along each of the three spatial axes.

Figure 5C:
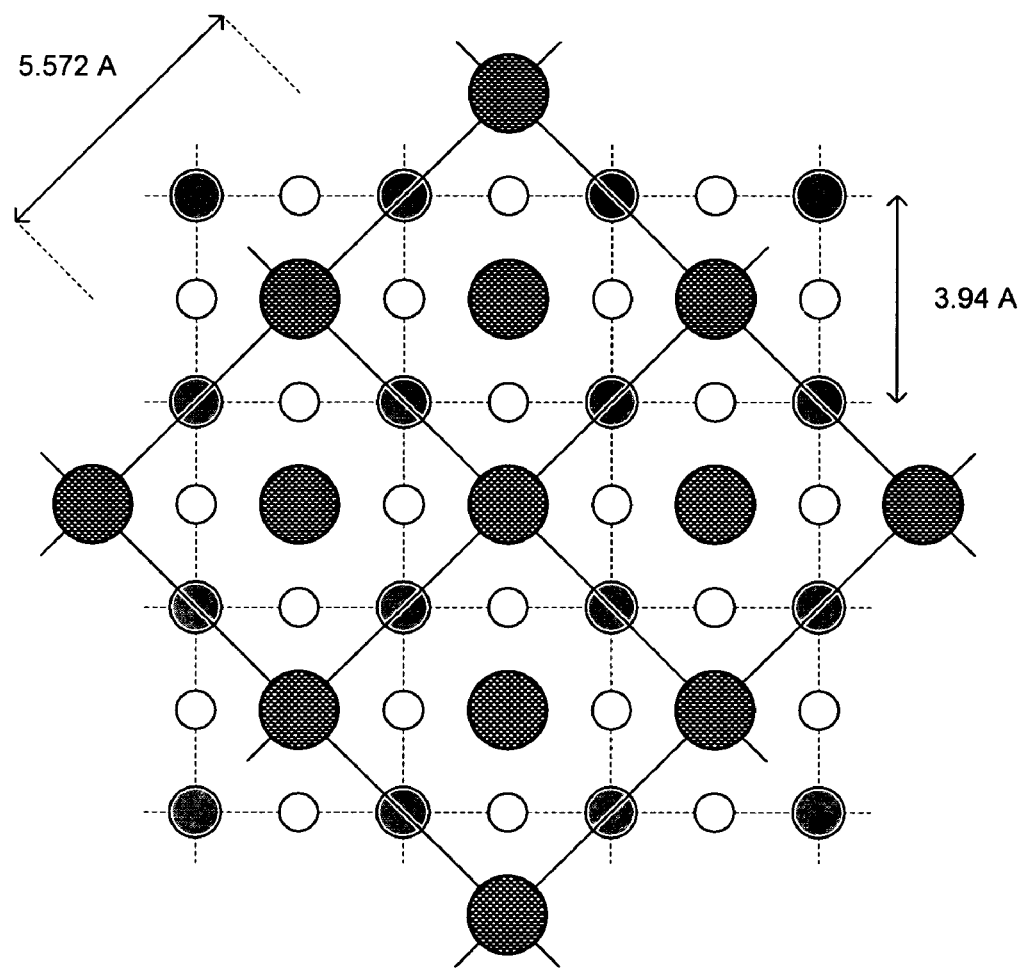

Although the diamond lattice is structurally different than the perovskite lattice, the two lattices may be compatible for purposes of epitaxial growth depending on the spacing of the atoms in each lattice. As seen in FIG. 5c, the atoms at the face of the silicon diamond lattice align with the empty faces of the gadolinium scandate perovskite lattice when the (001) plane of the silicon lattice is rotated by 45 degrees with respect to the (001) plane of the gadolinium scandate lattice. Thus the gadolinium scandate lattice is capable of serving as a template for growth of silicon.

As shown in FIG. 5a, the lattice constant at the (001) faces of the gadolinium scandate lattice is 3.94 Å, and as shown in FIG. 5b, the lattice constant at the (001) faces of the relaxed silicon lattice is 5.431 Å. However, the diagonal distance between the centers of the faces in the gadolinium scandate lattice is 5.572 Å, which is approximately 2.7% greater than the 5.431 Å lattice constant of pure relaxed silicon. For purposes of comparison, pure relaxed germanium has a lattice constant of germanium 5.657 Å, which is approximately 4.2% greater than that of silicon. Conventional strained silicon devices use a supporting layer of silicon germanium $Si_{1-x}Ge_x$ having a lattice constant that is between those two values and depends on the amount of germanium in the lattice. Germanium percentages between approximately 10% and 40% are typically used in conventional strained silicon devices, resulting in lattices having lattice constants that are effectively between 0.9% to 1.7% greater than that of silicon.

To characterize the lattice mismatch between a perovskite lattice and a diamond lattice, this disclosure will utilize a quantity referred to as the "effective lattice constant" of the perovskite lattice. In a perovskite lattice having essentially cubic unit cells, the effective lattice constant may be defined as the distance between the centers of diagonally oriented unit cell faces. In a perovskite lattice that is somewhat distorted from cubic form and thus has diamond shaped unit cell faces with diagonals of different lengths, the diagonal distances between face centers will depend on the direction of measurement. In such cases, the effective lattice constant may be defined as the average of the two diagonal distances between face centers. However, in implementations in which this characteristic is exploited, such as implementations in which it is desired to impart a strain to an overlying semiconductor lattice in a manner that has a greater magnitude in one direction compared to another, the effective lattice constant may be defined as the distance between diagonal face centers in the direction of either the greater or lesser distance.

The exemplary measurements given above are specific to $GdScO_3$, and other rare earth scandates with different effective lattice constants may be designed to produce a desired degree of mismatch with respect to an epitaxial semiconductor lattice. For example, in one alternative the compound dysprosium scandate ($DyScO_3$) may be employed. $DyScO_3$ has an effective lattice constant of approximately 5.6 Å. In another alternative, a rare earth scandate alloy such as $Gd_{1-x}Dy_xScO_3$ may be designed with stoichiometric proportions of gadolinium and dysprosium that are selected to provide a desired effective lattice constant. In general, for applications involving the growth of tensile strained silicon on a rare earth scandate dielectric, the effective lattice constant of the rare earth scandate is preferably greater than the lattice constant of relaxed silicon (5.431 Å), and preferably less than the lattice constant of relaxed germanium (5.657 Å), and is more preferably less than the lattice constant of a relaxed silicon germanium alloy comprised of 40% germanium (5.519 Å).

The use of a dielectric layer having a perovskite lattice structure, such as a rare earth scandate, enables the growth of silicon, germanium, a silicon germanium alloy, or a compound semiconductor material directly on the dielectric material. The ratios of silicon and germanium in the silicon germanium alloy may be chosen with respect to the effective lattice constant of the dielectric substrate to produce a variety of effects. For example, the silicon germanium alloy may be designed to have a lattice constant that is smaller than the effective lattice constant of the dielectric material, resulting in the application of a desired amount of tensile strain in the silicon germanium alloy. Alternatively, the silicon germanium alloy may be designed to have a lattice constant that is greater than the effective lattice constant of the dielectric material, resulting in the application of a desired amount of compressive strain on the silicon germanium alloy. Compressively strained germanium may also be grown on the rare earth scandate dielectric. Further, given a substrate having a layer of a rare earth scandate with a given effective lattice constant, silicon and silicon germanium alloys having different stoichiometric ratios may be grown at selected locations on the substrate to provide coexisting regions of tensile and compressively strained semiconductor materials. These may be used, for example, to produce CMOS devices comprised of an NMOS device having a tensile strained channel providing enhanced electron mobility, and a PMOS device having a compressively strained channel providing enhanced hole mobility.

An SOI substrate including a gadolinium scandate dielectric layer or another rare earth scandate dielectric layer may be produced in a number of manners. Gadolinium scandate may be deposited by molecular beam epitaxy, in which beams of each of the elemental constituents are directed in stoichiometric amounts through an ultra-high vacuum toward a substrate where they combine chemically. Alternatively, pulsed laser deposition may be used, in which a gadolinium scandate target is vaporized by an ultraviolet laser and recrystallized on the surface of the substrate. Pulsed laser deposition may be preferable to molecular beam epitaxy because it is capable of producing more rapid growth. Chemical vapor deposition may also be used. It is notable that these methods produce a dielectric layer having a relatively smooth surface. A semiconductor layer subsequently grown on the dielectric layer has a thickness variability that is substantially less than that of layers that have been thinned by polishing.

Typically the rare earth scandate layer is formed on a substrate having a silicon germanium layer at its surface. The silicon germanium layer is typically grown on a silicon wafer in a graded fashion in which the percentage content of germanium is gradually increased from zero to a desired percent. This allows the growth of a relaxed silicon germanium layer having a desired lattice constant. The rare earth scandate is then formed on the silicon germanium layer such as by one of the techniques described above. Depending on the implementation, the silicon germanium layer may be designed to have a lattice constant that matches the effective lattice constant of the rare earth scandate, or that is smaller than the effective lattice constant of the rare earth scandate so as to compress the rare earth scandate lattice and reduce its effective lattice constant.

Figure 6A:
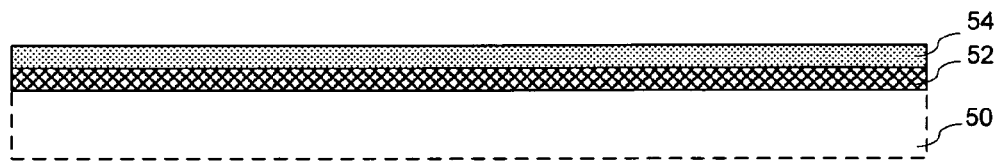
FIGS. 6a, 6b, 6c, 6d, 6e and 6f show structures formed during production of a strained silicon SOI MOSFET in accordance with an exemplary embodiment of the invention.

FIGS. 6a–6f show structures formed during fabrication of a tensile strained SOI MOSFET in accordance with an exemplary embodiment of the invention. FIG. 6a shows an SOI substrate comprising a silicon germanium layer 50. As described above, the silicon germanium layer 50 is typically grown on a silicon wafer, and has a graded composition with a percentage content of germanium at the surface that provides a desired lattice constant. For example, in an exemplary embodiment the surface of the silicon germanium layer may be a relaxed silicon germanium alloy comprised of approximately 20% germanium.

A dielectric layer 52 of a material having a perovskite lattice is formed on the silicon germanium layer 50. In the exemplary embodiment, the dielectric material is a rare earth scandate such as gadolinium scandate. The dielectric layer 52 may be formed by various techniques such as molecular beam epitaxy, pulsed laser deposition or chemical vapor deposition. In the exemplary embodiment, the gadolinium scandate layer is formed to a thickness of 100 Å–200 Å.

A semiconductor layer 54 is grown on the dielectric layer 52. The semiconductor layer 54 is a single crystal layer and may be composed of silicon, germanium, a silicon germanium alloy, a compound semiconductor such as a III–V or II–VI type semiconductor, or another semiconductor material having a diamond lattice. The thickness of the semiconductor layer may be chosen in accordance with the particular implementation. In the exemplary embodiment, the semiconductor layer is a silicon layer having a thickness of approximately 200 Å. In fully depleted SOI devices the semiconductor layer 54 is typically undoped, however doping may be performed in accordance with the particular implementation.

Figure 6B:

FIG. 6b shows the structure of FIG. 6a after selective etching of the semiconductor layer 54 to form isolated islands of semiconductor material on which individual devices will be formed.

Figure 6C:
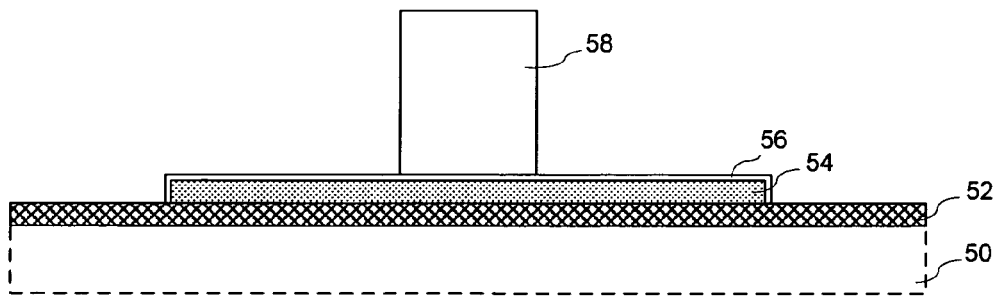

FIG. 6c shows the structure of FIG. 6b after formation of a gate insulating layer 56 over the semiconductor layer 54, followed by formation of a polysilicon gate 58 on the gate insulating layer 56. The gate insulating layer 56 may be grown by thermal oxidation of the semiconductor layer 54 or by deposition of a dielectric material. The polysilicon gate may be formed by blanket deposition of a polysilicon layer followed by patterning of the polysilicon layer.

Figure 6D:
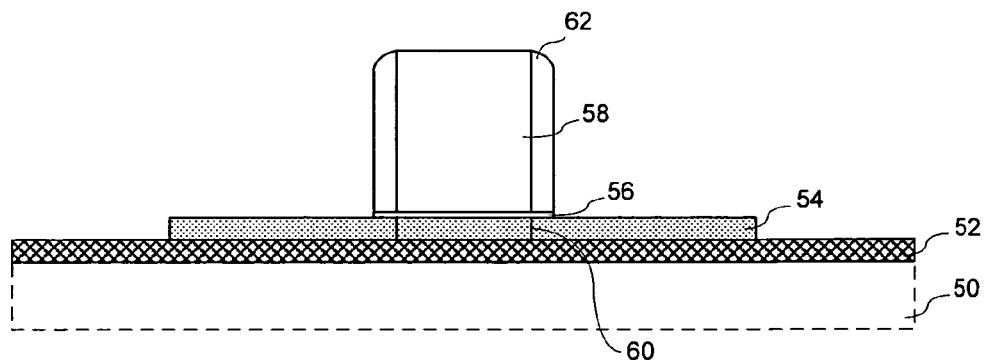

FIG. 6d shows the structure of FIG. 6c after implantation of dopant by ion implantation to form source and drain extensions 60 in the semiconductor layer 54 at opposing sides of the gate 58, followed by formation of a spacer 62 around the gate 58. The gate 58 masks the channel region during implantation of the source and drain extensions 60. The spacer 62 may be formed by blanket deposition of silicon oxide, followed by a directional etch back process to remove oxide from the horizontal surfaces.

Figure 6E:
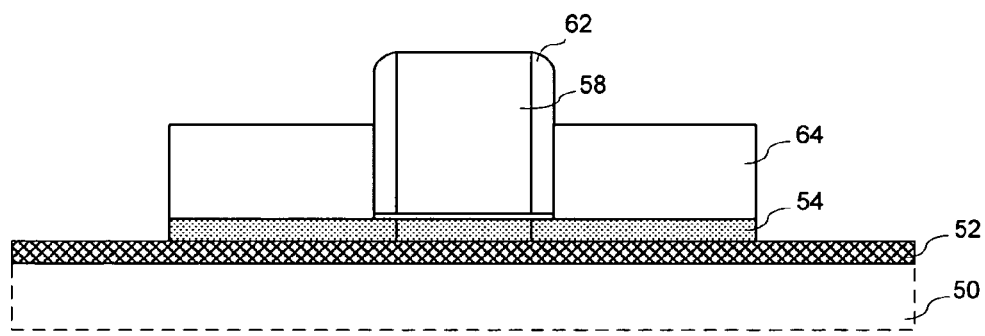

FIG. 6e shows the structure of FIG. 6d after formation of elevated source and drain regions 64 in contact with the semiconductor layer 54 at adjacent sides of the gate 58. The elevated source and drain regions 64 are grown by selective epitaxial growth of silicon. Typically the growth rate of silicon on the semiconductor layer 54 is significantly greater than the growth rate of silicon on the surrounding exposed dielectric layer 52. In addition, the atmosphere in the deposition chamber typically includes HCl, which produces a degree of etching of the deposited silicon. Through control of deposition parameters, the epitaxial growth process may be optimized to produce zero net growth of silicon on the exposed portions of the dielectric layer 52. Alternatively, a brief etch-back may be performed after formation of the elevated source and drain regions 64 to remove any silicon that has accumulated on the dielectric layer 52. The source and drain regions 64 may be doped in situ or by an implantation process.

Figure 6F:
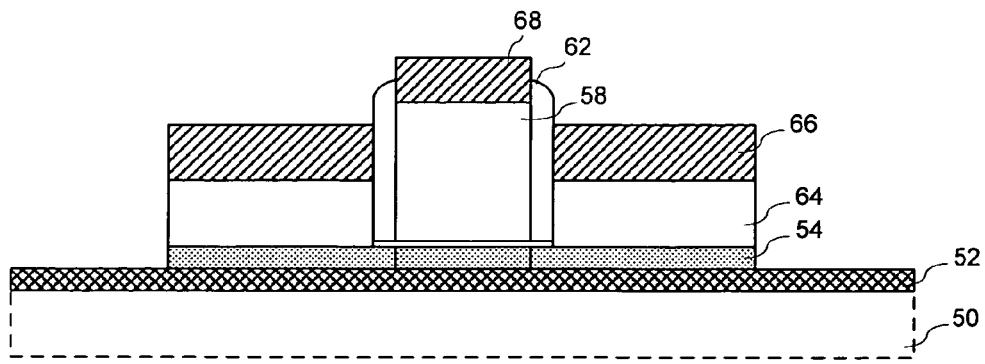

FIG. 6f shows the structure of FIG. 6e after formation of source and drain silicides 66 and a gate silicide 68. The silicides 66 and 68 are formed of a compound comprising the silicon material of the gate 58 and the source and drain regions 64 and a metal such as cobalt (Co) or nickel (Ni). The silicides 66 and 68 are formed by depositing a thin conformal layer of the metal over the entire structure, and then annealing to promote silicide formation at the points of contact between the metal and underlying semiconductor materials, followed by stripping of residual metal. Formation of silicides is typically preceded by a patterning step to remove oxides and protective layers from portions of the source and drain regions and gate where the silicides are to be formed.

The processing of FIGS. 6a–6f represents one example of MOSFET formation using an SOI substrate comprised of a layer of a rare earth scandate formed on a layer of silicon germanium, however a variety of alternative MOSFET structures may be implemented. In general terms, an electronic device in accordance with an embodiment of the invention comprises a substrate that includes a layer of a dielectric material having perovskite lattice, and a layer of a single crystal semiconductor material formed on the layer of the perovskite material. A MOSFET incorporating the semiconductor material in its channel region may be formed on the substrate. The MOSFET may be structured in the manners shown herein or in a variety of other manners. The dielectric material and the semiconductor material may be designed to produce a desired amount of either a tensile or a compressive strain in the semiconductor material, and the strain may be directional in accordance with the shapes of faces of unit cells in the dielectric material.

Figure 7:
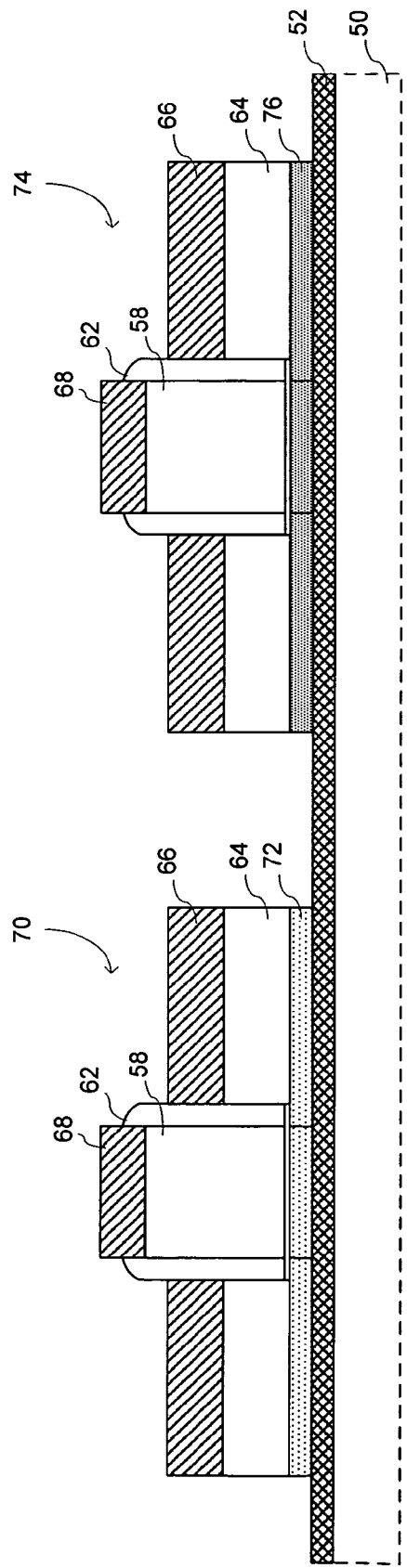
FIG. 7 shows elements of a CMOS device in accordance with an exemplary embodiment.

FIG. 7 shows an example of elements of a CMOS device composed of first and second SOI MOSFETs formed in accordance with an embodiment of the invention. In this structure, an n-type MOSFET device 70 incorporates a semiconductor region 72 formed on a dielectric layer 52 of a substrate. The semiconductor region 72 is composed of a first silicon germanium alloy having a lattice constant that is less than the effective lattice constant of the dielectric layer 52, causing a tensile strain to be imparted to the semiconductor region 72 and increasing the mobility of electrons in the n-type MOSFET. The structure further includes a p-type MOSFET device 74 that incorporates a semiconductor region 76 formed on a dielectric layer 52 of the substrate. The semiconductor region 76 is composed of a second silicon germanium alloy having a lattice constant that is greater than the effective lattice constant of the dielectric layer 52, causing a compressive strain to be imparted to the semiconductor region 76 and increasing the mobility of holes in the p-type MOSFET. The n-type and p-type MOSFETs may be connected to form a CMOS device in which each device benefits from enhanced carrier mobility through the use of different silicon germanium alloys having different types of strain imparted thereto by the dielectric layer.

The structure of FIG. 7 may be fabricated in a variety of manners. Typically two independent growth steps will be performed to grow semiconductor regions having different lattice constants for the respective p-type and n-type devices. These regions may be grown in the shapes that will be utilized in the devices, or may be grown and then patterned to exact dimensions. Alternatively, a layer of one of the alloys may be grown across the wafer, and then silicon or germanium may be implanted in selected regions to alter the stoichiometric ratios in those regions to form the second alloy.

While the structure of FIG. 7 utilizes two different silicon germanium alloys to produce different types of strain for nMOS and pMOS device, in alternative embodiments different types of semiconductor materials with appropriate lattice constants may be utilized. Further, dielectric material lattice properties may be designed to provide directionality of strain. The MOSFETs may be structured in the manners shown in FIG. 7 or in a variety of other manners.

The tasks described in the above processes are not necessarily exclusive of other tasks, and further tasks may be incorporated into the above processes in accordance with the particular structures to be formed. For example, intermediate processing tasks such as formation or removal of passivation layers or protective layers between processing tasks, formation or removal of photoresist masks and other masking layers, doping and counter-doping, cleaning, planarization, and other tasks, may be performed along with the tasks specifically described above. Further, the processes described herein need not be performed on an entire substrate such as an entire wafer, but may instead be performed selectively on sections of the substrate. Also, while tasks performed during the fabrication of structure described herein are shown as occurring in a particular order for purposes of example, in some instances the tasks may be performed in alternative orders while still achieving the purpose of the process. Thus, while the embodiments illustrated in the figures and described above are presently preferred, it should be understood that these embodiments are offered by way of example only. The invention is not limited to a particular embodiment, but extends to various modifications, combinations, and permutations that fall within the scope of the claims and their equivalents.

What is claimed is:

1. A method for forming a semiconductor on insulator (SOI) MOSFET device, comprising:
   providing a substrate comprising a layer of gadolinium scandate ($GdScO_3$) dielectric material;
   growing a layer of a semiconductor material on the layer of the dielectric material;
   etching the layer of semiconductor material to form an isolated region of semiconductor material for formation of a MOSFET;
   forming a gate insulator over the isolated region of semiconductor material; and
   forming a gate on the gate insulator.

2. The method claimed in claim 1, wherein the semiconductor material is a single crystal material having a diamond lattice.

3. The method claimed in claim 1, wherein the semiconductor material is grown on the (001) face of the gadolinium scandate ($GdScO_3$) lattice.

4. The method claimed in claim 1, wherein the layer of semiconductor material is a silicon layer.

5. The method claimed in claim 4, wherein the gadolinium scandate ($GdScO_3$) lattice imparts a tensile strain to the silicon layer.

6. The method claimed in claim 1, wherein the layer of semiconductor material is a silicon germanium layer.

7. The method claimed in claim 6, wherein the gadolinium scandate ($GdScO_3$) lattice imparts a tensile strain to the silicon germanium layer grown on the gadolinium scandate ($GdScO_3$) lattice.

8. The method claimed in claim 6, wherein the gadolinium scandate ($GdScO_3$) lattice imparts a compressive strain to the silicon germanium layer grown on the gadolinium scandate ($GdScO_3$) lattice.

9. The method claimed in claim 1, wherein the layer of semiconductor material is a germanium layer.

10. The method claimed in claim 1, wherein the layer of semiconductor material is a compound semiconductor material.

11. The method claimed in claim 1, wherein forming the MOSFET further comprises:
    forming a spacer around the gate; and
    selectively growing semiconductor source and drain regions on the semiconductor layer at opposing sides of the gate.

12. A method for forming a semiconductor on insulator (SOI) MOSFET device, comprising:
    providing a substrate comprising a layer of dysprosium scandate ($DyScO_3$) dielectric material;
    growing a layer of a semiconductor material on the layer of the dielectric material; and
    etching the layer of semiconductor material to form an isolated region of semiconductor material for formation of a MOSFET;
    forming a gate insulator over the isolated region of semiconductor material; and
    forming a gate on the gate insulator.

13. The method claimed in claim 12, wherein the semiconductor material is a single crystal material having a diamond lattice.

14. The method claimed in claim 12, wherein the semiconductor material is grown on the (001) face of the dysprosium scandate ($DyScO_3$) lattice.

15. The method claimed in claim 12, wherein the layer of semiconductor material is a silicon layer.

16. The method claimed in claim 15, wherein the dysprosium scandate ($DyScO_3$) lattice imparts a tensile strain to the silicon layer.

17. The method claimed in claim 12, wherein the layer of semiconductor material is a silicon germanium layer.

18. The method claimed in claim 17, wherein the dysprosium scandate ($DyScO_3$) lattice imparts a tensile strain to the silicon germanium layer grown on the dysprosium scandate ($DyScO_3$) lattice.

19. The method claimed in claim 17, wherein the dysprosium scandate ($DyScO_3$) lattice imparts a compressive strain to the silicon germanium layer grown on the dysprosium scandate ($DyScO_3$) lattice.

20. The method claimed in claim 12, wherein the layer of semiconductor material is a germanium layer.

21. The method claimed in claim 12, wherein the layer of semiconductor material is a compound semiconductor material.

22. The method claimed in claim 12, wherein forming the MOSFET further comprises:
    forming a spacer around the gate; and
    selectively growing semiconductor source and drain regions on the semiconductor layer at opposing sides of the gate.

23. A method for forming a semiconductor on insulator (SOI) MOSFET device, comprising:
    providing a substrate comprising a layer of a dielectric material, wherein the dielectric material comprises of an alloy of gadolinium and dysprosium scandate ($Gd_{1-x}Dy_xScO_3$);
    growing a layer of a semiconductor material on the layer of the dielectric material; and
    etching the layer of semiconductor material to form an isolated region of semiconductor material for formation of a MOSFET;
    forming a gate insulator over the isolated region of semiconductor material; and
    forming a gate on the gate insulator.

24. The method claimed in claim 23, wherein the semiconductor material is a single crystal material having a diamond lattice.

25. The method claimed in claim 23, wherein the semiconductor material is grown on the (001) face of the gadolinium and dysprosium scandate ($Gd_{1-x}Dy_xScO_3$) alloy lattice.

26. The method claimed in claim 23, wherein the effective lattice constant of the gadolinium and dysprosium scandate ($Gd_{1-x}Dy_xScO_3$) alloy is in the range of 5.431 Å to 5.657 Å.

27. The method claimed in claim 23, wherein the effective lattice constant of the gadolinium and dysprosium scandate ($Gd_{1-x}Dy_xScO_3$) alloy is in the range of 5.431 Å to 5.519 Å.

28. The method claimed in claim 23, wherein the layer of semiconductor material is a silicon layer.

29. The method claimed in claim 28, wherein the gadolinium and dysprosium scandate ($Gd_{1-x}Dy_xScO_3$) alloy lattice imparts a tensile strain to the silicon layer.

30. The method claimed in claim 23, wherein the layer of semiconductor material is a silicon germanium layer.

31. The method claimed in claim 30, wherein the gadolinium and dysprosium scandate ($Gd_{1-x}Dy_xScO_3$) alloy lattice imparts a tensile strain to the silicon germanium layer grown on the gadolinium and dysprosium scandate ($Gd_{1-x}Dy_xScO_3$) alloy layer.

32. The method claimed in claim 30, wherein the gadolinium and dysprosium scandate ($Gd_{1-x}Dy_xScO_3$) alloy lattice imparts a compressive strain to the silicon germanium layer grown on the gadolinium and dysprosium scandate ($Gd_{1-x}Dy_xScO_3$) layer.

33. The method claimed in claim 23, wherein the layer of semiconductor material is a germanium layer.

34. The method claimed in claim 23, wherein the layer of semiconductor material is a compound semiconductor material.

35. The method claimed in claim 23, wherein forming the MOSFET further comprises:
   forming a spacer around the gate; and
   selectively growing semiconductor source and drain regions on the semiconductor layer at opposing sides of the gate.

* * * * *